United States Patent
Li et al.

(10) Patent No.: US 6,358,839 B1
(45) Date of Patent: Mar. 19, 2002

(54) SOLUTION TO BLACK DIAMOND FILM DELAMINATION PROBLEM

(75) Inventors: Lain-Jong Li, Hualien; ShwangMing Jeng; Syun-Ming Jang, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/578,412

(22) Filed: May 26, 2000

(51) Int. Cl.⁷ .......................................... H01L 21/4763
(52) U.S. Cl. ...................... 438/624; 438/622; 438/623; 438/631; 438/633; 438/669; 438/672; 438/680; 438/687
(58) Field of Search ................ 438/622, 623, 438/624, 631, 633, 669, 672, 680, 687

(56) References Cited

U.S. PATENT DOCUMENTS 5,541,445 A * 7/1996 Quellet ........................ 257/634
5,851,892 A   12/1998 Lojek et al. ................. 438/305
6,025,280 A   2/2000  Brady et al. ................. 438/762
6,232,658 B1 * 5/2001 Catabay et al. .............. 257/701

OTHER PUBLICATIONS

BD Reference Found on the Web–Site for Applied Materials in the form of a Press Release dated Feb. 28, 2000.

* cited by examiner

Primary Examiner—John F. Niebling
Assistant Examiner—David A. Zarneke
(74) Attorney, Agent, or Firm—George O. Saile; Stephen B. Ackerman

(57) ABSTRACT

Low k dielectrics such as black diamond have a tendency to delaminate from the edges of a silicon wafer, causing multiple problems, including blinding of the alignment mark. This problem has been overcome by inserting a layer of silicon nitride between the low k layer and the substrate. A key requirement is that said layer of silicon nitride be under substantial compressive stress (at least $5 \times 10^9$ dynes/cm²). In the case of a layer of black diamond, on which material the invention is particularly focused, a nucleating layer is also inserted between the silicon nitride and the black diamond. A process for laying down the required layers is described together with an example of applying the invention to a dual damascene structure.

14 Claims, 3 Drawing Sheets

SOLUTION TO BLACK DIAMOND FILM DELAMINATION PROBLEM

FIELD OF THE INVENTION

The invention relates to the general field of low dielectric constant layers for use in integrated circuits with particular reference to methods for preventing peeling and delamination of such films.

BACKGROUND OF THE INVENTION

The internal dimensions within integrated circuits continue to shrink, including the thicknesses of the dielectric layers used to separate various layers of wiring from one another. However, as these wiring levels are brought closer together, the possibility of cross-coupling between them starts to rise as well as the incidence of parasitic capacitances. One way to minimize this problem is to reduce the dielectric constants of these inter-metal layers. Thus there is considerable interest in developing low k materials as well as deposition methods for them that are compatible with integrated circuit technology.

For our purposes we will define a low k dielectric as one that has a dielectric constant close to or less than about 3. Several such materials are known to exist but they have the disadvantage that they are organic rather than inorganic compounds. Examples include hydrogen silsesquioxane, fluorinated polyimide, polyarylene ether, fluorinated arylene ether, polytetrafluoro-ethylene, and benzocyclobutene. Because of their organic nature these materials are innately soft, which physical property can give rise to problems during semiconductor processing, particularly during planarization, by chemical mechanical polishing (CMP).

The present invention is concerned with low dielectric constant materials that are inorganic in nature, such as spin-on glass (SOG), fluorinated silicon glass (FSG) and, particularly, methyl-doped porous silica which is referred to by practitioners of the art as black diamond, or BD. When formed as will be described below, about 36% of a BD layers volume is in the form of pores having a diameter between about 8 and 24 Angstroms.

Dual damascene structures have received widespread application in recent years so it is important that processes for laying down low dielectric constant materials be compatible with such structures. An example of a dual damascene structure is schematically illustrated in FIG. 1. See there is a substrate 11 over which two layers of dielectric material 14 and 15 have been deposited. Via hole 14 has been etched through lower dielectric layer 14 and trench 13 (long dimension running normal to the plane of the figure) has been etched through upper dielectric layer 15. Via and trench were over-filled with metal (usually copper) and then the upper surface was planarized, as shown.

Inorganic low k dielectrics enjoy several advantages over the organic variety, such as good thermal conductivity suitability for production, but one problem associated with them is that many of them, when in thin film form, are found to be in a state of high tensile stress. This is the case, regardless of how they are deposited. Because of this, low k inorganic films have a tendency to delaminate, particularly near the edges of the substrate where the restoring forces are the strongest. This is illustrated in FIG. 2 which shows silicon wafer 22 which has been coated with a layer of (for example) BD. For a 25 cm. wafer, an outer annular region 23, whose width varies between about 0.5 and 2 cm. has a tendency to come away. Aside from the yield loss in the affected area, the delaminated film is a source of particulate contamination and, most importantly, the wafer alignment mark (shown schematically in the figure as area 24) can easily be obscured (blinded) by this.

A routine search of the prior art was performed but no references that teach the exact processes and structures of the present invention were discovered. Several references of interest were, however, encountered along the way. For example, in U.S. Pat. No. 6,025,280, Brady et al. show a low k oxide process using nitrous oxide and TEOS with an organic reactant. In U.S. Pat No. 5,851,892, Lojek et al. show an oxidation process using a nitrogen pre-anneal. Reference to BD was found on the web-site for Applied Materials in the form of a press release dated Feb. 28, 2000 describing this material.

SUMMARY OF THE INVENTION

It has been an object of the present invention to provide a process for depositing a layer of low dielectric constant material on a substrate without subsequent delamination of said layer.

Another object of the invention has been to provide a process for depositing a layer of black diamond on a silicon wafer without subsequent delamination of said layer.

A further object of the invention has been to provide a dual damascene structure in which the dielectric is black diamond.

A still further object has been to provide a process for forming said dual damascene structure.

These objects have been achieved by inserting a layer of silicon nitride between the low k layer and the substrate. A key requirement is that said layer of silicon nitride be under substantial compressive stress (at least $5 \times 10^9$ dynes/cm$^2$). In the case of a layer of black diamond, on which material the invention is particularly focused, a nucleating layer is inserted between the silicon nitride and the black diamond. A process for laying down the required layers is described along with an example of applying the invention to a dual damascene structure.

DESCRIPTION OF THE PREFERRED EMBODIMENTS

We will disclose the present invention through a description of a process for forming a dual damascene structure. At the end of this description the structure of the present invention will also be apparent. We note here that copper-filled damascene structures normally include glue and barrier layers but, since the present invention does not depend on their presence in order to be effective, they have not been included in our description, thereby simplifying it.

Figure 1:
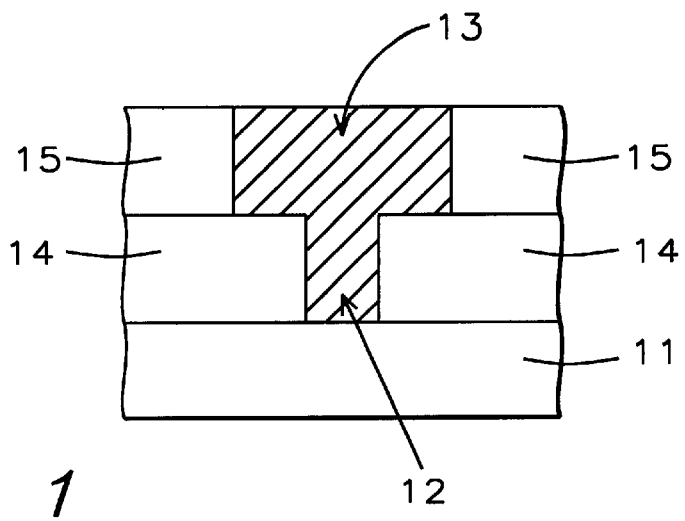
FIG. 1 illustrates a typical dual damascene structure.
Figure 2:
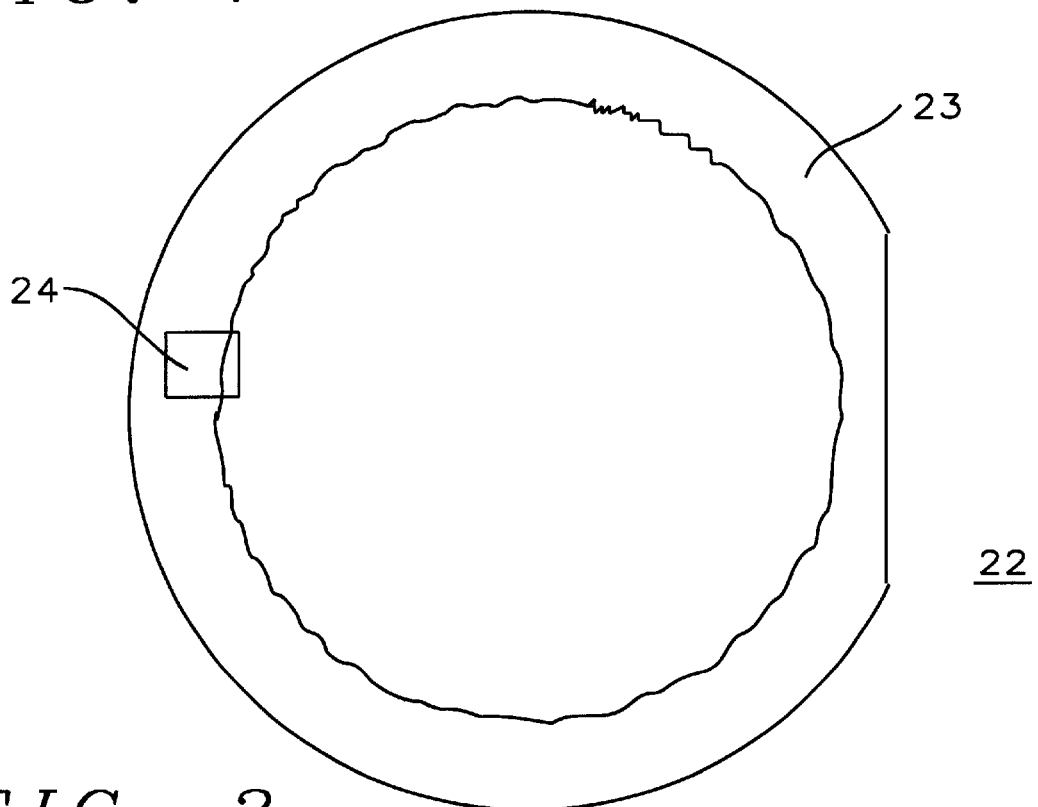
FIG. 2 shows how a low k dielectric film can delaminate from the surface of a silicon wafer.
Figure 3:
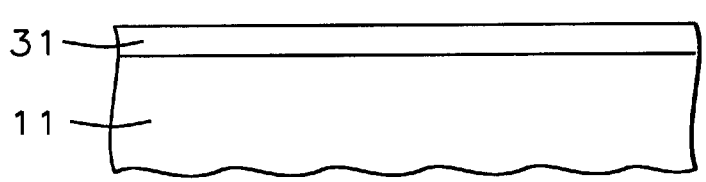
FIG. 3 shows the starting point for the process of the present invention.

Referring now to FIG. 3, the process of the present invention begins with the provision of substrate 11 which is most commonly, though not necessarily, a silicon wafer. Silicon nitride layer 31 is deposited onto substrate 11 to a thickness between about 300 and 600 Angstroms. It is a key feature of the invention that this layer be deposited under conditions that ensure that it is in a state of compressive stress of magnitude greater than about $5\times10^9$ dynes/cm$^2$, with a stress level between about $7\times10^9$ and $1.5\times10^{10}$ dynes/cm$^2$ being preferred.

The exact method by which the silicon nitride is deposited is not critical as long as these levels of compressive stress are attained. One deposition method that ensures this is PECVD (Plasma Enhanced Chemical Vapor Deposition). We used Applied materials' DX chamber at an RF power between about 500 and 650 watts. Gas flow rates were between about 60 and 80 SCCM for silane, between about 2,300 and 2,700 SCCM for nitrogen, and between about 25 and 35 SCCM for ammonia.

Figure 4:
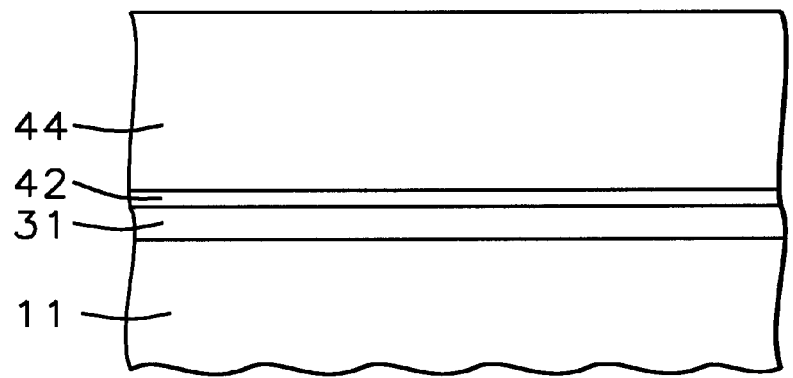
FIGS. 4 to 6 show successive stages in the process of the present invention.

Referring now to FIG. 4, silicon nitride layer 31 is then exposed to a gaseous mixture of methyl silane, nitrous oxide, and oxygen, enhanced by a helium plasma at a power level of about 200 watts, for about 2 seconds, thereby forming, through chemical vapor deposition, nucleation layer 42 (having a thickness between about 200 and 400 Angstroms) on all exposed surfaces of silicon nitride 31. Flow rates for the gases are: for the methyl silane between about 50 and 90 SCCM, for the nitrous oxide between about 350 and 400 SCCM, and for the oxygen between about 10 and 50 SCCM.

Then, nucleation layer 42 is exposed to a gaseous mixture of methyl silane and nitrous oxide, enhanced by a helium plasma at a power level of about 110 watts, thereby forming on nucleation layer 42, through chemical vapor deposition, a layer of black diamond 44 having a thickness between about 2,000 and 6,000 Angstroms. Flow rates for the gases are: for the methyl silane, between about 50 and 90 SCCM and for the nitrous oxide between about 350 and 400 SCCM.

Figure 5:
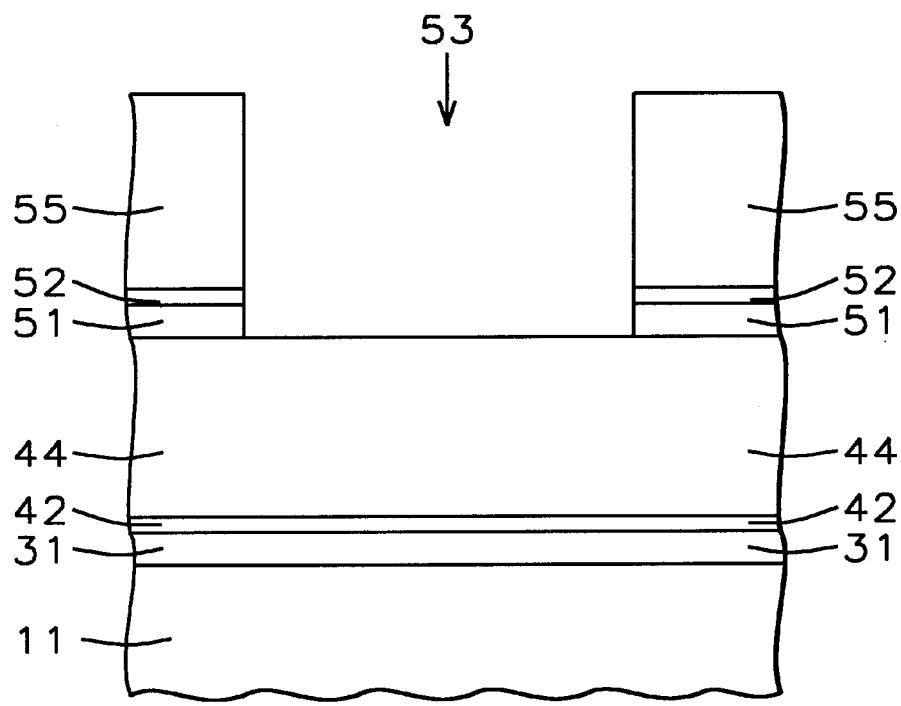

Proceeding now to FIG. 5, the two previous deposition steps are repeated. That is, silicon nitride layer 51 is deposited (to a thickness between about 300 and 600 Angstroms) onto black diamond layer 44 also under conditions that ensure that layer 51 is in a state of compressive stress of magnitude greater than about $5\times10^9$ dynes/cm$^2$, with a stress level between about $7\times10^9$ and $1.5\times10^{10}$ dynes/cm$^2$ being preferred. Layer 51 is then exposed to a gaseous mixture of methyl silane, nitrous oxide, and oxygen, enhanced by a helium plasma at a power level of about 200 watts, for about 2 seconds, thereby forming, through chemical vapor deposition, nucleation layer 52 (to a thickness between about 200 and 400 Angstroms) over which is deposited layer of black diamond 55 (having a thickness between about 2,000 and 6,000 Angstroms).

Then, still referring to FIG. 5, black diamond layer 55, nucleation layer 52, and silicon nitride layer 51 are all etched through a suitably patterned mask (not shown) down to the level of black diamond layer 44 to form wiring trench 53.

Figure 6:
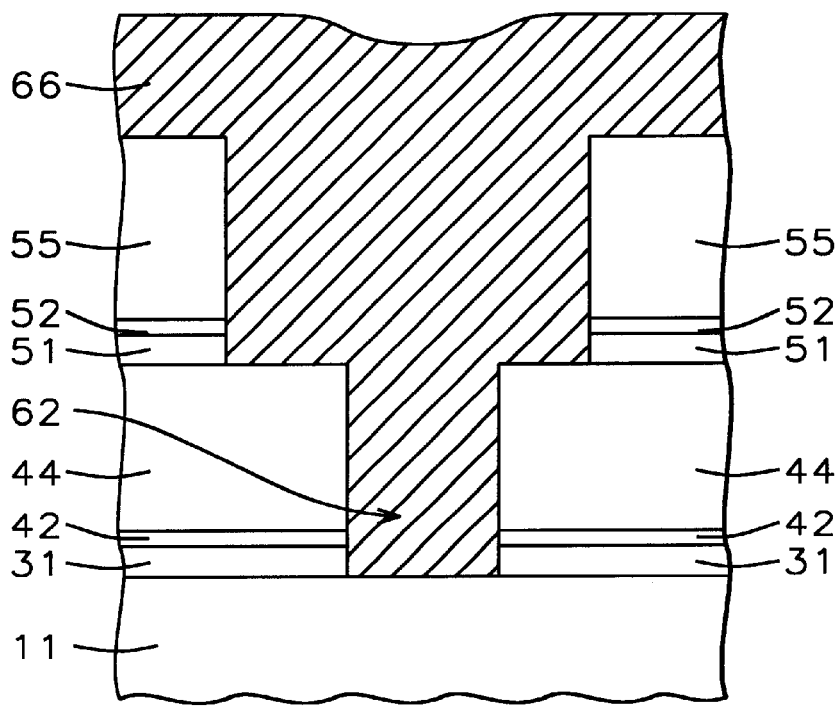

The penultimate step of the process is illustrated in FIG. 6. First, via hole 62 is etched through black diamond layer 44, nucleation layer 42, and silicon nitride layer 31 down to the level of substrate 11 (in general a silicon wafer). Copper is then deposited to a thickness sufficient to fill the via hole and to over-fill the wiring trench.

Figure 7:
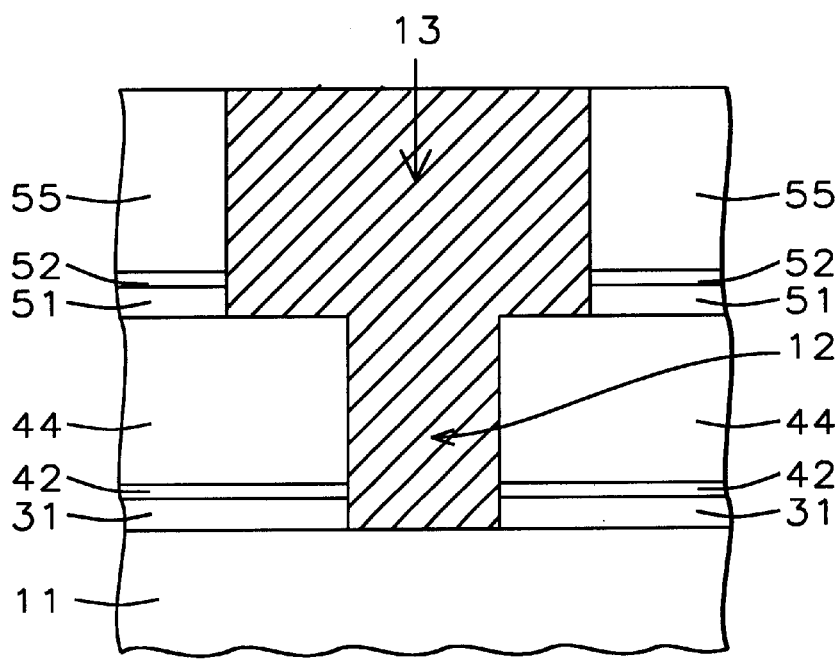
FIG. 7 shows the structure that is obtained at the conclusion of the process of the present invention.

The process concludes, as shown in FIG. 7, with the application of chemical mechanical polishing to the structure seen in FIG. 6, thereby planarizing said structure and making certain that no copper remains on any exposed surface outside the trench.

It will be understood by those skilled in the art that the process and structure of the present invention are not limited to damascene processes and structures, being of a more general nature whereby said process may be effectively used to deposit on a substrate any one of a family of low dielectric constant inorganic materials. In particular, the process may be used to deposit on a silicon wafer a layer of black diamond that will not subsequently delaminate, whether or not it includes a damascene structure.

Furthermore, while the invention has been particularly shown and described with reference to the preferred embodiments thereof, it will be understood by those skilled in the art that various changes in form and details may be made without departing from the spirit and scope of the invention.

What is claimed is:

1. A process for depositing a layer of low dielectric constant material on a substrate, comprising:

onto said substrate, depositing a layer of silicon nitride that is in a state of compressive stress, said stress having a value of at least $5\times10^9$ dynes/cm$^2$; and then depositing the layer of low dielectric constant material on said silicon nitride layer.

2. The process recited in claim 1 wherein the low k dielectric material is selected from the group consisting of spin-on glass, fluorinated silicon glass, black diamond, and poly(arylene ether) polyimide.

3. The process recited in claim 1 wherein the stress value of the silicon nitride layer is between about $7\times10^9$ and $1.5\times10^{10}$ dynes/cm$^2$.

4. The process recited in claim 1 wherein the step of depositing the layer of silicon nitride further comprises using PECVD at an RF power between about 500 and 650 watts with gas flow rates between about 60 and 80 SCCM for silane, between about 2,300 and 2,700 SCCM for nitrogen, and between about 25 and 35 SCCM for ammonia.

5. The process recited in claim 1 wherein the low k dielectric layer is deposited to a thickness between about 2,000 and 6,000 Angstroms and the silicon nitride layer is deposited to a thickness between about 300 and 600 Angstroms.

6. A process for depositing a layer of black diamond on a silicon wafer, comprising:

onto said wafer, depositing a layer of silicon nitride that is in a state of compressive stress, said stress having a value of at least $5\times10^9$ dynes/cm$^2$ and the silicon nitride layer having a thickness between about 300 and 600 Angstroms;

exposing said layer of silicon nitride to a first gaseous mixture of methyl silane, nitrous oxide, and oxygen, enhanced by a helium plasma at a power level of about 200 watts, for about 2 seconds, thereby forming, through chemical vapor deposition, a nucleation layer having a thickness between about 200 and 400 Angstroms on all exposed surfaces of the silicon nitride; and then exposing said nucleation layer to a second gaseous mixture of methyl silane and nitrous oxide, enhanced by a helium plasma at a power level of about 110 watts, thereby forming, through chemical vapor deposition, the layer of black diamond.

7. The process recited in claim 6 wherein the stress value of the silicon nitride layer is between about $7\times10^9$ and $1.5\times10^{10}$ dynes/cm$^2$.

8. The process recited in claim 6 wherein the step of depositing the layer of silicon nitride further comprises using PECVD at an RF power between about 500 and 650 watts with gas flow rates between about 60 and 80 SCCM for silane, between about 2,300 and 2,700 SCCM for nitrogen, and between about 25 and 35 SCCM for ammonia.

9. The process recited in claim 6 wherein the layer of black diamond is deposited to a thickness between about 2,000 and 6,000 Angstroms.

10. The process recited in claim 6 wherein, in the first gaseous mixture, the methyl silane has a flow rate between about 50 and 90 SCCM, the nitrous oxide has a flow rate between about 350 and 400 SCCM, and the oxygen has a flow rate between about 10 and 50 SCCM.

11. The process recited in claim 6 wherein, in the second gaseous mixture, the methyl silane has a flow rate between about 50 and 90 SCCM and the nitrous oxide has a flow rate between about 350 and 400 SCCM.

12. A process for forming a dual damascene structure on a silicon wafer, comprising:

(a) onto said wafer, depositing a layer of silicon nitride that is in a state of compressive stress, said stress having a value of at least $5 \times 10^9$ dynes/cm$^2$;

(b) exposing said layer of silicon nitride to a first gaseous mixture of methyl silane, nitrous oxide, and oxygen, enhanced by a helium plasma at a power level of about 200 watts, for about 2 seconds, thereby forming, through chemical vapor deposition, a nucleation layer on all exposed surfaces of the silicon nitride;

(c) then exposing said nudeation layer to a second gaseous mixture of methyl silane and nitrous oxide, enhanced by a helium plasma at a power level of about 110 watts, thereby forming on the nucleation layer, through chemical vapor deposition, a layer of black diamond;

(d) repeating steps (a), (b), and (c), thereby forming upper and lower layers of silicon nitride and black diamond;

(e) patterning and etching said upper black diamond and silicon nitride layers down to the level of the lower layer of black diamond, thereby forming a wiring trench;

(f) patterning and etching said lower black diamond and silicon nitride layers down to the level of the silicon wafer, thereby forming a via hole;

(g) depositing a layer of copper to a thickness sufficient to fill the via hole and to over-fill the wiring trench; and (h) by means of chemical mechanical polishing, removing copper until said wiring trench is just filled and there is no copper on any exposed surface outside the trench.

13. The process recited in claim 12 wherein the lower layer of silicon nitride is deposited to a thickness between about 300 and 600 Angstroms and the upper layer of silicon nitride is deposited to a thickness between about 300 and 600 Angstroms.

14. The process recited in claim 12 wherein the lower layer of black diamond is deposited to a thickness between about 2,000 and 6,000 Angstroms and the upper layer of black diamond is deposited to a thickness between about 2,000 and 6,000 Angstroms.

* * * * *